United States Patent
Onomura et al.

(10) Patent No.: US 6,873,634 B2
(45) Date of Patent: Mar. 29, 2005

(54) SEMICONDUCTOR LASER DIODE

(75) Inventors: Masaaki Onomura, Setagaya-Ku (JP);
Mariko Suzuki, Yokohama (JP);
Masayuki Ishikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 263 days.

(21) Appl. No.: 09/964,463

(22) Filed: Sep. 28, 2001

(65) Prior Publication Data

US 2002/0039374 A1 Apr. 4, 2002

(30) Foreign Application Priority Data

Sep. 29, 2000 (JP) ........................................ 2000-301435

(51) Int. Cl.$^7$ ................................................. H01S 5/00
(52) U.S. Cl. ......................................... 372/45; 372/46
(58) Field of Search ..................................... 372/43–50

(56) References Cited

U.S. PATENT DOCUMENTS

| | | | |
|---|---|---|---|
| 5,253,264 A | 10/1993 | Suzuki et al. .................. | 372/46 |
| 5,274,649 A | 12/1993 | Hirayama et al. ............. | 372/20 |
| 5,347,526 A | 9/1994 | Suzuki et al. .................. | 372/20 |
| 5,488,233 A | 1/1996 | Ishikawa et al. .............. | 257/94 |
| 5,696,389 A | 12/1997 | Ishikawa et al. .............. | 257/99 |
| 5,732,098 A | 3/1998 | Nisitani et al. ................ | 372/45 |
| 5,780,873 A | 7/1998 | Itaya et al. .................. | 257/521 |
| 5,821,555 A | 10/1998 | Saito et al. .................... | 257/13 |
| 5,972,730 A | 10/1999 | Saito et al. .................... | 438/39 |
| 6,005,263 A | 12/1999 | Saito et al. .................. | 257/200 |
| 6,031,858 A | 2/2000 | Hatakoshi et al. ............. | 372/46 |
| 6,060,335 A | 5/2000 | Rennie et al. ................. | 372/45 |
| 6,067,309 A | 5/2000 | Onomura et al. .............. | 372/46 |
| 6,121,634 A | 9/2000 | Saito et al. .................... | 257/86 |
| 6,172,382 B1 * | 1/2001 | Nagahama et al. ........... | 372/45 |
| 6,185,238 B1 | 2/2001 | Onomura et al. .............. | 372/46 |
| 6,229,834 B1 | 5/2001 | Nisitani et al. ................ | 372/45 |
| 6,252,894 B1 * | 6/2001 | Sasanuma et al. ............. | 372/45 |
| 6,400,742 B1 | 6/2002 | Hatakoshi et al. ............. | 372/46 |
| 6,631,149 B1 * | 10/2003 | Tezen et al. ................... | 372/43 |

FOREIGN PATENT DOCUMENTS

| | | | | |
|---|---|---|---|---|
| EP | 1017113 A1 * | 7/2000 | ........... | H01L/33/00 |
| JP | 09-219556 | 8/1997 | | |
| JP | 11-195840 | 7/1999 | | |
| JP | 11-238945 | 8/1999 | | |
| JP | 11251685 A * | 9/1999 | ............. | H01S/3/18 |

* cited by examiner

*Primary Examiner*—Quyen Leung
(74) *Attorney, Agent, or Firm*—Oblon, Spivak, McClelland, Maier & Neustadt, P.C.

(57) ABSTRACT

The present invention provides a nitride semiconductor laser by which stable high power room-temperature continuous-wave oscillation in fundamental mode is possible. A semiconductor laser diode comprising: a GaN layer; a first conductive type nitride semiconductor layer formed on said GaN layer and made of $Al_xGa_{1-x}N(0.04 \leq x \leq 0.08)$; a first conductive type clad layer formed on said first conductive type nitride semiconductor layer and made of nitride semiconductor; a core area formed on said first conductive type clad layer and made of nitride semiconductor, said core area including an active layer to emit light by electric current injection; and a second conductive type clad layer formed on said core area and made of nitride semiconductor.

21 Claims, 4 Drawing Sheets

SEMICONDUCTOR LASER DIODE

CROSS-REFERENCE TO RERATED APPLICATIONS

This application is based upon and claims the benefit of priority from the prior Japanese Patent Application No.2000-301435, filed on Sep. 29, 2000, the entire contents of which are incorporated herein by reference.

BACKGROUND OF THE INVENTION

1. Field of the Invention

The present invention relates to a semiconductor laser diode.

2. Related Background Art

In late years, a semiconductor laser diode is used for reading and writing means for an optical disk in high-density optical disk system. For this semiconductor laser diode, InGaAlP compound semiconductor laser diode in the 600 nm wavelength range has been developed, and optical disk system such as DVD has been realized. In the DVD, high output power of about 10 mW and 50 mW is required for a semiconductor laser diode for reading and writing respectively.

Recently, development of a semiconductor laser diode having shorter wavelength is proceeding in order to increase the record density. As such laser diode, attention is paid to a GaN compound laser diode made of InGaAlBN. This GaN compound laser diode is demonstrated to have a wavelength of about 400 nm, and to have a lifetime longer than several thousand hours under room-temperature continuous-wave (cw) operation. This GaN compound laser diode is supposed to be promising on the basis of reliability.

For optical disk applications of GaN compound laser diodes, control of the oscillation mode characteristics is indispensable. However, in conventional GaN compound laser diode, there are some problems that it is difficult to obtain fundamental oscillation.=More specifically, there are some problems regarding control and stabilization of transverse modes perpendicular to the junction plane in conventional GaN compound laser diodes. One is that it is difficult to grow thick AlGaN clad layers due to the generation of cracks. This is why the differences of lattice constant and thermal expansion coefficient between the clad layer and other layers/substrate are large. Another is that the refractive index of GaN is higher than that of AlGaN, and so the mode field has a high optical confinement factor in the p/n-type GaN contact layers. As a result, the oscillating waveguide mode becomes a high-order transverse mode. Furthermore, the effective refractive index of the oscillating mode is lower than that of the GaN contact layers. Therefore, the resultant oscillating mode is predicted to behave as an anti-guide mode. So, in conventional GaN compound laser diode, it is difficult to obtain single-peak far-field pattern perpendicular to the junction plane. However, in laser diodes, single-peak far-field pattern is important because laser beam is focused on a minute spot when used. So, the conventional GaN compound laser diode can't be used stably until high output power, and threshold current density for the lasing increases with a decreasing optical confinement factor in such anti-guide structures.

On the other hand, if clad layer is thickened until the thickness required for fundamental transverse mode oscillation, there occurs a problem that lots of crack or crystal defects are generated. When the cracks or crystal defects are generated, laser oscillation becomes unstable, because leak current increases and the diode becomes liable to generate heat.

SUMMARY OF THE INVENTION

The present invention is based on recognition of aforementioned problems. It is therefor an object of the invention to provide a nitride semiconductor laser diode by which stable high power room-temperature continuous-wave oscillation in fundamental transverse mode is possible.

According to embodiments of the present invention, there is provided a nitride semiconductor laser diode comprising:

a semiconductor laser diode comprising:

a GaN layer;

a first conductive type nitride semiconductor layer formed on said GaN layer and made of $Al_xGa_{1-x}N(0.04 \leq x \leq 0.08)$;

a first conductive type clad layer formed on said first conductive type nitride semiconductor layer and made of nitride semiconductor;

a core area formed on said first conductive type clad layer and made of nitride semiconductor, said core area including an active layer to emit light by electric current injection; and a second conductive type clad layer formed on said core area and made of nitride semiconductor.

According to embodiments of invention, there is further provided a semiconductor laser diode comprising:

a sapphire substrate;

an n-type GaN contact layer formed on said sapphire substrate;

an n-type nitride semiconductor layer formed on said n-type GaN contact layer and made of $Al_xGa_{1-x}N$ $(0.04 \leq x \leq 0.08)$;

an n-type superlattice clad layer formed on said n-type nitride semiconductor layer and having a superlattice structure in which $Al_yGa_{1-y}N(0.05 \leq y \leq 0.20, x<y)$ and GaN are alternately laminated;

a core area formed on said n-type superlattice clad layer and made of nitride semiconductor, said core area including an active layer having a multiple quantum well structure with multiple InGaN quantum well layers, said active layer emitting light by electric current injection;

a p-type superlattice clad layer formed on said core area and having a superlattice structure in which $Al_zGa_{1-z}N$ $(0<z \leq 1.0)$ and GaN are alternately laminated;

a p-type GaN contact layer formed on said p-type superlattice clad layer made of a p-type GaN;

a p-type electrode formed on said p-type GaN contact layer injecting electric current into said active layer; and an n-type electrode formed on said n-type GaN contact layer injecting electric current into said active layer.

According to embodiments of invention, there is further provided a semiconductor laser diode comprising:

an n-type GaN substrate;

an n-type GaN contact layer formed on one side of said GaN substrate;

an n-type nitride semiconductor layer formed on said n-type GaN contact layer and made of $Al_xGa_{1-x}N$ $(0.04 \leq x \leq 0.08)$;

an n-type superlattice clad layer formed on said n-type nitride semiconductor layer and having a superlattice structure in which $Al_yGa_{1-y}N(0.05 \leq y \leq 0.20, x<y)$ and GaN are alternately laminated;

a core area formed on said n-type superlattice clad layer and made of nitride semiconductor, said core area including an active layer having a multiple quantum well structure with multiple InGaN quantum well layers, said active layer emitting light by electric current injection;

a p-type superlattice clad layer formed on said core area and having a superlattice structure in which $Al_zGa_{1-z}N$ ($0<z\leq1.0$) and GaN are alternately laminated;

a p-type GaN contact layer formed on said p-type superlattice clad layer made of a p-type GaN;

a p-type electrode formed on said p-type GaN contact layer injecting electric current into said active layer; and an n-type electrode formed on the other surface of said n-type GaN substrate in order to inject electric current into said active layer.

DETAILED DESCRIPTION OF THE INVENTION

Embodiments of the present invention will now be explained referring to drawings. A high-power nitride compound semiconductor laser diode using a sapphire substrate and a high-power nitride compound semiconductor laser diode using a GaN substrate will be explained in the first and the second embodiments respectively.

(First Embodiment)

Figure 1:
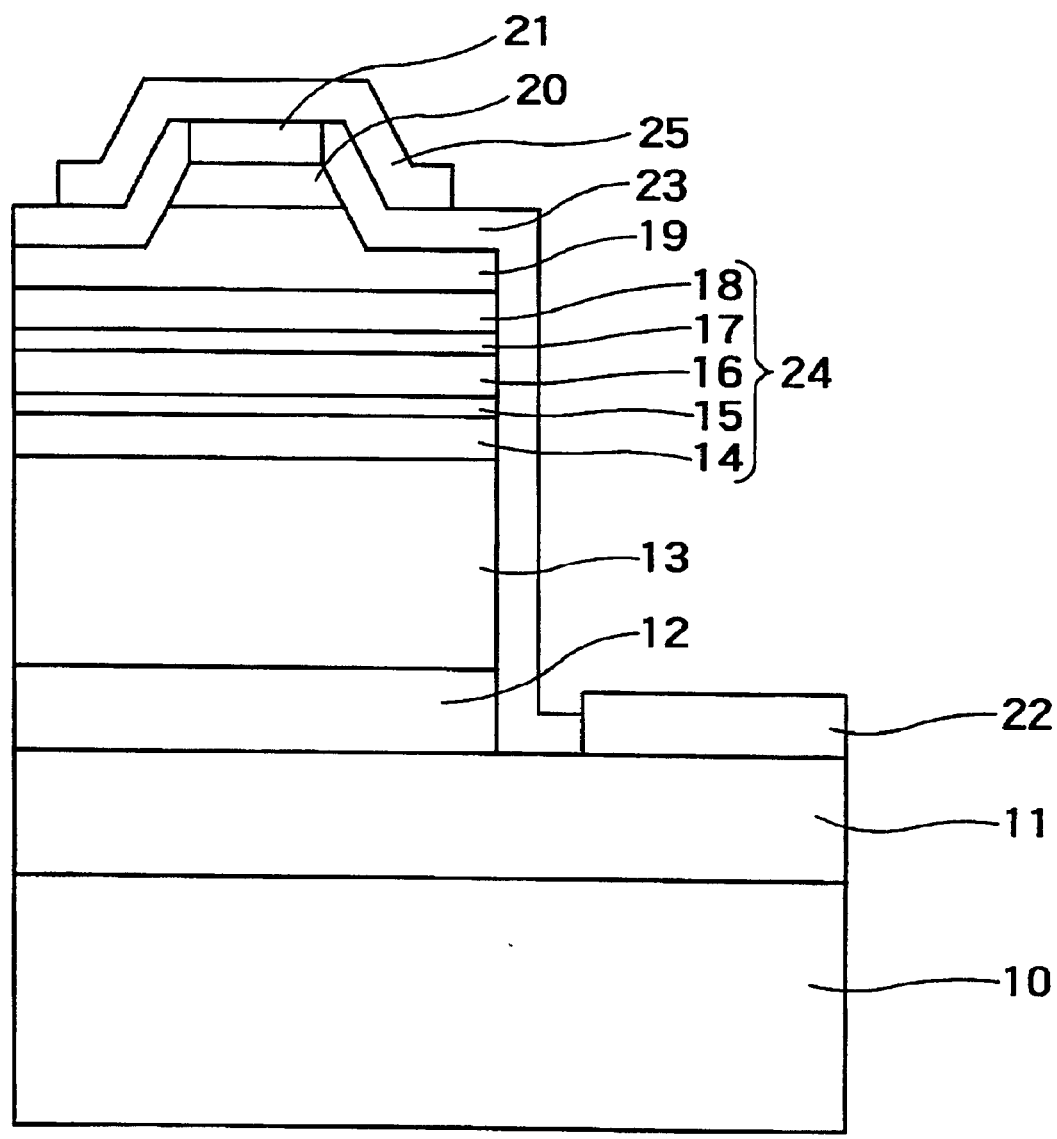
FIG. 1 is a schematic cross-sectional view showing a nitride compound semiconductor laser diode according to the first embodiment of the present invention.

FIG. 1 is a schematic cross-sectional view showing a nitride compound semiconductor laser diode according to the first embodiment of the present invention. On a sapphire substrate 10, an n-type GaN contact layer 11 with a thickness of 3 μm, an n-type nitride semiconductor layer ($Al_{0.05}Ga_{0.95}N$ optical confinement layer) 12 with a thickness of 0.6 μm, an n-type superlattice clad layer 13 with a thickness of 1.2 μm made of n-type $Al_{0.15}Ga_{0.85}N/GaN$, a core area 24, a p-type superlattice clad layer 19 made of p-type $Al_{0.15}Ga_{0.85}N/GaN$ and a p-type GaN contact layer 20 are formed sequentially. A core area 24 comprises an n-type GaN waveguide layer 14, an n-type $Al_{0.25}Ga_{0.75}N$ overflow prevention layer 15, an active layer 16 with $In_{0.11}Ga_{0.89}N/In_{0.03}Ga_{0.97}N$ multiple quantum well (MQW) structure, a p-type $Al_{0.25}Ga_{0.75}N$ overflow prevention layer 17 and a p-type GaN waveguide layer 18. The structure where overflow prevention layers 15, 17, and waveguide layers 14, 18 are equipped on both surfaces of the active layer is called "SCH (Separate Confinement Heterostructure)". The p-type clad layer 19 and the p-type contact layer 20 are etched back in convex stripe shape from the top side of the figure. A p-type electrode 21 as an electrode on one side is formed on the p-type contact layer 20. An n-side electrode 22 as the other side electrode is formed on the n-type contact layer 11. Layers shown above are covered with an insulation film 23. An electrode pad 25 is formed above the p-type electrode 21 and the insulation film 23 in the figure. FIG. 1 is a schematic view, so each layer is indicated with the thickness changed.

In the laser diode of FIG. 1, electric current is injected from the n-side electrode 22 and the p-side electrode 21 to the active layer 16. And electrons and holes are re-combined at the active layer 16 to emit light. The light generated by stimulated emission in a resonator mirror is amplified to be laser beam. The laser beam with a wavelength about 405 nm is emitted from the end surface of the core area 24.

Figure 2:
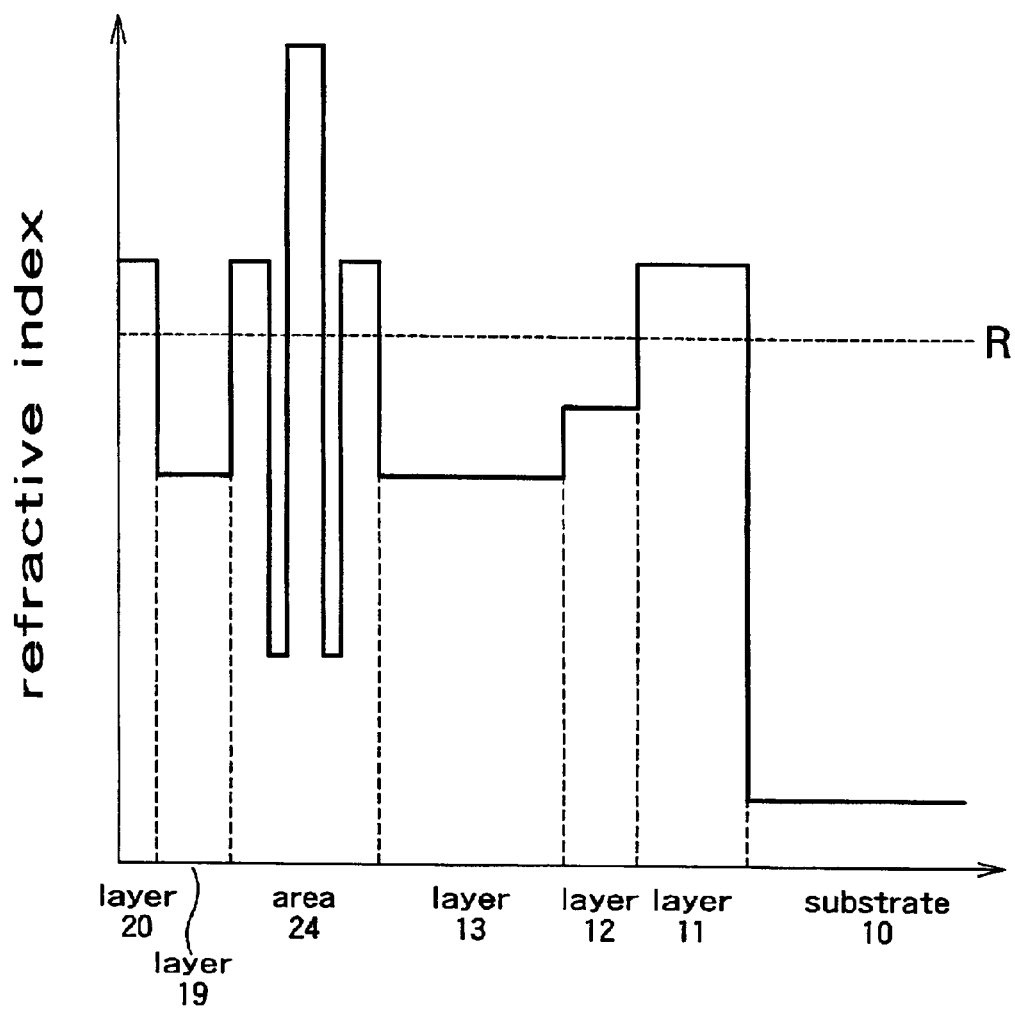
FIG. 2 shows a refractive index of each layer in the nitride compound semiconductor laser diode according to the first embodiment of the present invention.

FIG. 2 shows the refractive index of each layer. Horizontal axis indicates each layer of the laser diode shown in FIG. 1, and longitudinal axis indicates the refractive index. The core area 24 has multiple layers, and each of multiple layers has different refractive index. The effective refractive index R of the oscillating mode in this laser diode is indicated by the broken line in the figure. As recognized from FIG. 2, the refractive index of the n-type superlattice clad layer 13 and the p-type superlattice clad layer 19 is lower than the effective refractive index R. If the n-type superlattice clad layer 13 and the p-type superlattice clad layer 19 are thick enough, there is no problem because the light generated at the core area 24 can be confined. However, if the n-type superlattice clad layer 13 and the p-type superlattice clad layer 19 are thin, the leakage of the transverse mode to the n-type GaN contact layer 11 occurs. So, in the laser diode shown in FIGS. 1 and 2, n-type nitride semiconductor layer layer 12 having a refractive index lower than the effective refractive index R is formed. As a result, the optical leaking outside of the n-type superlattice clad layer 13 is attenuated enough by the n-type nitride semiconductor layer 12. And, the leakage of the transverse mode to the n-type GaN contact layer 11 is eliminated, the n-type GaN contact layer 11 having a refractive index higher than the effective refractive index R. On the other hand, the leakage of the transverse mode to the p-type contact layer 20 is not eliminated. However, the p-type superlattice clad layer 19 need not be so thick because the p-side electrode 21 functions as a layer to absorb the amplitude of guided modes. Here, the n-type nitride semiconductor layer 12 will be referred to as an n-type $Al_{0.05}Ga_{0.95}N$ optical confinement layer 12 in the following.

Production method of the laser diode shown in FIG. 1 will now be explained. An example that the nitride compound semiconductor is grown in MOCVD method is shown here, the nitride semiconductor may be grown with molecular beam epitaxy (MBE) method.

First, pre-treatment is performed on the sapphire substrate 10 having (0001) as the main surface. And the substrate 10 is set to the MOCVD chamber. Then, the temperature in the chamber is increased to 1080° C. in an atmosphere containing hydrogen and nitrogen carrier gas. The n-type GaN contact layer 11 with a thickness of 3 μm, the n-type $Al_{0.05}Ga_{0.95}$ N optical confinement layer 12 with a thickness of 0.6 μm, the superlattice clad layer 13 with a thickness of 1.2 μm made of n-type $Al_{0.15}Ga_{0.85}N/GaN$, the n-type GaN waveguide layer 14 with a thickness of 0.1 μm, the n-type $Al_{0.25}Ga_{0.75}N$ overflow prevention layer 15 with a thickness of 20 nm are formed sequentially. In this process, Trimethylgallium, trimethylaluminum and ammonia are used for the raw material of Ga, Al and N respectively. Composition ratio of Al and Ga was adjusted by the flow ratio of trimethylgallium and trimethylammonium. Si is used for an impurity of the n-type. Silane is used as a raw material of Si. Organic silane such as tetraethylsilane may be used as raw materials of Si.

Next, the temperature in the chamber is decreased to 800° C., and the active layer 16 with $In_{0.11}Ga_{0.89}N/In_{0.03}Ga_{0.97}N$ multiple quantum well structure is formed under nitrogen gas atmosphere. At the moment, trimethylindium is used as a raw material of In. More specifically, the active layer has a structure where $In_{0.11}Ga_{0.89}N$ well layer (three layers) with a thickness of 4 nm and $In_{0.03}Ga_{0.97}N$ barrier layer (four layers) with a thickness of 8 nm are alternately laminated.

Next, the temperature in the chamber is increased to 1080° C. under nitrogen gas atmosphere. And, the p-type $Al_{0.25}Ga_{0.75}N$ overflow prevention layer 17 with a thickness of 20 nm is formed. After that, the GaN waveguide layer 18 with a thickness of 0.1 μm, the p-type clad layer 19 with a thickness of 1 μm made of p-type $Al_{0.15}Ga_{0.85}N$/GaN, the p-type GaN contact layer 20 with a thickness of 20 nm are formed sequentially.

Next, part of the p-type GaN contact layer 20 and the p-type superlattice clad layer 19 are removed by etching until the halfway of the p-type superlattice clad layer 19 in such a manner that a striped area with 2 μm width is reserved. Thus, a striped ridge area is formed. It is desirable that the thickness of the area of the p-type superlattice clad layer 19 which is not etched is 0.2 μm or less in order to obtain a difference of refractive index to set the horizontal transverse mode in fundamental mode.

Next, partial etching is performed from the p-type superlattice clad layer 19 to the n-type $Al_{0.05}Ga_{0.95}N$ n-type optical confinement layer 12. An n-side electrode 22 is formed on the exposed n-type GaN contact layer 11. A p-side electrode 21 is formed on the p-type GaN contact layer 20.

Next, the substrate and laminated layers are cleaved or cut to make lots of chips, and the chips are fabricated in such a manner that the cavity length is 600 μm. A film with high reflectance made of dielectric multilayer film is coated on the cavity facets. The chip is bonded to a heat sink via metalized film of Ti/Pt/Au formed on the heat sink, by thermo-compression method using AuSn eutectic solder. The heat sink is a heat sink with high thermal conduction made of Cu, cubic aluminum nitride, diamond, or etc. Au wiring, etc is used for a wiring to inject electric current.

One of the feature of the laser diode of FIG. 1 manufactured by the method shown above is that the 0.6-μm-thick n-type $Al_{0.05}Ga_{0.95}N$ optical confinement layer 12 is formed between 3-μm-thick n-type GaN contact layer 11 and 1.2-μm-thick n-type superlattice clad layer 13. The refractive index of the n-type $Al_{0.05}Ga_{0.95}N$ optical confinement layer 12 is lower than the effective refractive index of the oscillating mode R as shown in FIG. 2. So, the n-type $Al_{0.05}Ga_{0.95}N$ optical confinement layer 12 prevents amplitude of the guided modes to the n-type GaN contact layer 11. Thus, the laser diode in FIG. 1 provides a stable oscillation in fundamental mode in vertical transverse mode until high-power.

In spite of that, without the n-type $Al_{0.05}Ga_{0.95}N$ optical confinement layer 12, higher order transverse mode oscillation occurred because the amplitude of the guided modes get out from the core area 24 to the n-type GaN contact layer 11. The thickness of the n-type superlattice clad layer 13 should be grown to 1.8 μm in order to prevent it. However, the limit of the thickness of the n-type superlattice clad layer 13 which can be formed immediately on the n-type superlattice GaN contact layer 11 is 1.2 μm, and if the thickness exceeded the limit, cracks are generated.

However, using the n-type $Al_{0.05}Ga_{0.95}$ N optical confinement layer 12 should be far from expectation for a person skilled in that. When the n-type $Al_{0.05}Ga_{0.95}$ N optical confinement layer 12 is used, compared to the case when the n-type $Al_{0.05}Ga_{0.95}$ N optical confinement layer 12 is not used, it has been the general belief that cracks are more likely to occur due to the increased strain amount in the whole laminated structure. The n-type $Al_{0.05}Ga_{0.95}$ N optical confinement layer 12 differs in lattice constant from the n-type GaN contact layer 11. $Al_{0.05}Ga_{0.95}N$ has about 0.12% lower lattice constant compared to GaN (see FIG. 3 explained below). So, tensile strain is applied to the whole of the n-type optical confinement layer 12. In addition, the thickness of the n-type optical confinement layer 12 is so large as 0.6 μm, which is half of the n-type superlattice clad layer 13. In general, when $Al_{0.05}Ga_{0.95}$ N layer 12 having such large thickness is formed on GaN contact layer 11, cracks are likely to occur due to the lattice mismatching. In this reason, it has been thought that cracks are more likely to occur if n-type optical confinement layer 12 is used.

However, according to an experiment of the present inventors, generation of cracks has been suppressed noticeably by using the n-type $Al_{0.05}Ga_{0.95}$ N optical confinement layer 12. In the experiment of the present inventors, cracks did not occur even if the thickness of the n-type superlattice layer is about 8 μm when the n-type $Al_{0.05}Ga_{0.95}$ N optical confinement layer 12 is used. The present inventors assume its reason as follows. When the thickness of $Al_{0.05}Ga_{0.95}$ N optical confinement layer 12 is increased within the range that cracks do not occur (less than critical thickness), the lattice stress in the optical confinement layer 12 is diminished toward upward in FIG. 1. And the lattice constant of the $Al_{0.05}Ga_{0.95}$ N optical confinement layer 12 becomes nearly itself toward upward in FIG. 1. As explained above, tensile strain about 0.12% is generated in the lower part of the n-type $Al_{0.05}Ga_{0.95}$ N optical confinement layer 12 in FIG. 1. However, the lattice stress is enough diminished at the upper part of the n-type $Al_{0.05}Ga_{0.95}$ N optical confinement layer 12, because the thickness of n-type $Al_{0.05}Ga_{0.95}$ N optical confinement layer is so large as 0.6 μm. The difference of lattice constant between the optical confinement layer 12 and the n-type superlattice clad layer 13 becomes so small as about 0.02% that it can be almost ignored. So, the upper part of the optical confinement layer 12 in the figure has little strain and generates no crack.

Further, the dislocation density also can be reduced in the laser diode shown in FIG. 1. In the laser diode shown in FIG. 1, dislocation in vertical direction exists with density of $1 \times 10^{10} cm^{-2}$ or more in the GaN contact layer 11. On the other hand, the dislocation density can be reduced to $1 \times 10^4 cm^{-2}$ or less in the layers formed upper than the n-type superlattice clad layer 13 in the figure, for example, in the core area 24. The reason is that, according to an analysis of the present inventors, the dislocation which extends in the vertical direction is bent in the horizontal direction in the n-type $Al_{0.05}Ga_{0.95}$ N optical confinement layer 12 due to tensile strain, and further, at the boundary between the n-type $Al_{0.05}Ga_{0.95}$ N optical confinement layer 12 and the n-type superlattice clad layer 13, and in the n-type superlattice clad layer 13, the vertical direction is bent in the horizontal direction.

In the laser diode shown in FIG. 1, deterioration of the operating current with age can be reduced because of the reduction of the dislocation as shown above. More specifically, due to the reduction of the dislocation, leak current can be reduced, and diffusion of metal and dopant from the p-side electrode generated by heat can be reduced. As the result, deterioration of the operating current with age can be reduced.

The property of the semiconductor laser diode in FIG. 1 is measured and it is demonstrated to have threshold current 12 mA and operation voltage 4.2V with an oscillation wavelength of 405 nm under room-temperature continuous-wave operation. The maximum optical output exceeded 200 mW and the fundamental mode oscillation $TE_{00}$ without kink is obtained. Single-peaked emission with half width 22° in vertical direction and 10° in horizontal direction is obtained for far field pattern. Further, the laser diode is demonstrated to have a lifetime more than 10000 h under 50° C., 50 mW operation. The relative noise intensity is −135 db/Hz at 0° C. to 90° C. Thus, a nitride compound semiconductor laser diode by which stable high power continuous-wave oscillation in fundamental mode is possible can be obtained.

Al composition range of the $Al_xGa_{1-x}N$ of optical confinement layer 12 in FIG. 1 will now be discussed. In other words, the optical confinement layer 12 is made of $Al_{0.05}Ga_{0.95}N$ in the laser diode shown in FIG. 1, however, other composition of $Al_xGa_{1-x}N$ is also possible. So, the range will now be discussed.

Figure 3:
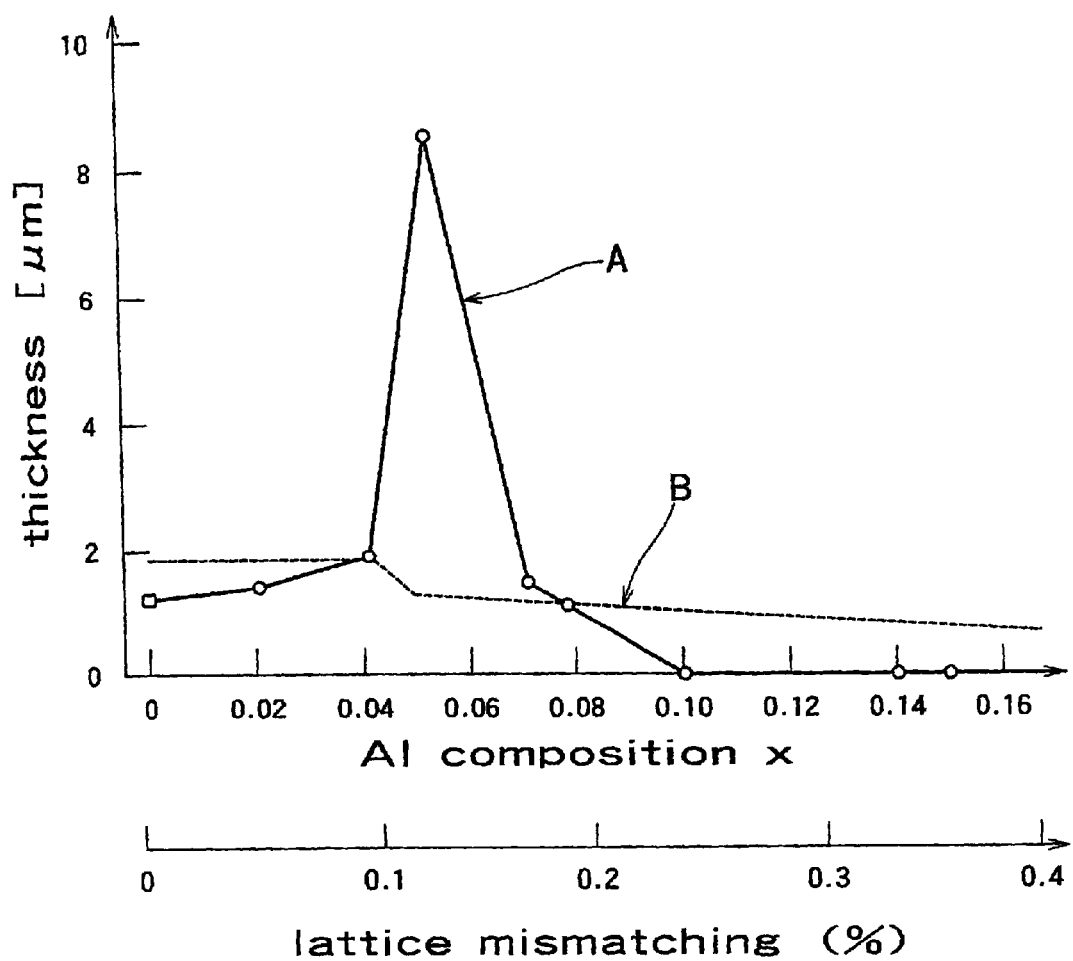
FIG. 3 shows a relationship between Al composition x of the n-type $Al_xGa_{1-x}N$ optical confinement layer 12 and the critical thickness of n-type superlattice clad layer 13 made of $Al_{0.15}Ga_{0.85}N/GaN$.

FIG. 3 shows a relationship between Al composition x of the n-type $Al_xGa_{1-x}N$ optical confinement layer 12 and the critical thickness of n-type superlattice clad layer 13 made of $Al_{0.15}Ga_{0.85}N/GaN$. In the figure, the horizontal axis indicates Al composition X of the n-type $Al_xGa_{1-x}N$ optical confinement layer 12 and lattice mismatching (%) against GaN. FIG. 3 shows data obtained in the case that the n-type $Al_xGa_{1-x}N$ optical confinement layer 12 with a thickness of 0.6 μm and the n-type superlattice clad layer 13 made of $Al_{0.15}Ga_{0.85}N/GaN$ are sequentially formed on the GaN contact layer 11 in FIG. 1. In the figure, the full line A indicates the critical thickness of the n-type superlattice clad layer 13. When the thickness of the n-type superlattice clad layer 13 exceeds the critical thickness, cracks occur in the n-type superlattice clad layer 13. In FIG. 3, the dashed line indicates the thickness of the n-type superlattice clad layer 13 required for obtaining fundamental mode at high power output.

In FIG. 3, the square at the left end of the full line A indicates the case that Al composition x of the n-type $Al_xGa_{1-x}N$ layer 12 is 0, which is substantially the same as the case that the n-type superlattice clad layer 13 is directly formed on the GaN contact layer 11. In this case, as shown above, the critical thickness A of the n-type superlattice clad layer 13 is about 1.2 μm. When Al composition x is increased, the critical thickness A does not change largely in the range of Al composition x less than 0.04. However, the critical thickness A increases noticeably when Al composition x exceeds 0.04 and approaches 0.05. After that, the critical thickness A will be reduced when Al composition is increased.

As shown in FIG. 3, in the range of Al composition x of the n-type $Al_xGa_{1-x}N$ layer 12 from 0.04 to 0.08, the critical thickness A of the n-type superlattice clad layer 13 exceeds the thickness B required for obtaining fundamental mode oscillation. So, in this range ($0.04 \leq x \leq 0.08$) of Al composition, a nitride compound semiconductor laser diode by which high power oscillation in fundamental mode is possible can be formed without generating cracks. Further, as shown in FIG. 3, when Al composition is set to about 5%, noticeable crack reduction effect is obtained and even if the n-type $Al_xGa_{1-x}N$ layer 12 is formed by about 8 μm cracks does not occur.

However, in FIG. 3, in the case Al composition x of the n-type $Al_xGa_{1-x}N$ layer 12 is $0.07 < x \leq 0.08$, cracks liable to occur, for example when n-type impurity dope is increased. So, it is desirable that Al composition x of the n-type $Al_xGa_{1-x}N$ layer 12 is $0.04 \leq x \leq 0.07$.

The dashed line B in FIG. 3 bends at about 0.04 or more of Al composition x. That is because the refractive index of the n-type $Al_xGa_{1-x}N$ optical confinement layer 12 became lower than the effective refractive index R of the oscillating mode and the n-type $Al_xGa_{1-x}N$ optical confinement layer 12 itself has optical confinement effect.

As shown above, Al composition x of the n-type $Al_xGa_{1-x}N$ optical confinement layer 12 should be $0.04 \leq x \leq 0.08$, preferably $0.04 \leq x \leq 0.07$, more preferably about 0.05. If Al composition x is set to $0.04 \leq x \leq 0.07$ as shown above, lattice mismatching between the n-type $Al_xGa_{1-x}N$ optical confinement layer 12 and the n-type GaN contact layer 11 is from 0.10% to 0.16% as recognized from the lower part of the horizontal axis of FIG. 3. As explained above, in the past, it has been supposed that cracks or crystal defects are liable to occur if a layer having such a lattice mismatching is formed. However, according to the experiment of the present inventors, the results are different from the conventional technical common knowledge.

In the semiconductor laser diode of FIG. 1 as explained above, the active layer 16 has a structure of $In_{0.11}Ga_{0.89}N/In_{0.03}Ga_{0.97}N$ multiple quantum well (MQW) structure. However, an active layer 16 with different structure may also be used, though it is preferable that In composition of the well layer is set to about 0.1 in order to obtain an oscillation wavelength of about 400 nm. The number of the quantum well layers may be also changed. Almost the same result as FIG. 3 may be obtained even if the number of well layers is changed. The smaller the number of well layers becomes the lower the effective refractive index R in FIG. 2 becomes. However, it does not have much effect on the result of FIG. 3. That is because the refractive index of the n-type $Al_xGa_{1-x}N$ optical confinement layer 12 becomes lower than the effective refractive index of the oscillating mode R and the n-type $Al_xGa_{1-x}N$ optical confinement layer 12 has optical confinement effect itself, even if single quantum well structure in which effective refractive index R become lowest is taken, as long as Al composition x is set to 0.04 or more.

The thickness of the n-type $Al_{0.05}Ga_{0.95}N$ optical confinement layer 12 is set to 0.6 μm in the semiconductor laser diode of FIG. 1. However, when the thickness is in the range from 0.6 μm to the critical thickness, the vertical horizontal mode control and crack suppression are performed enough. In particular, when the thickness is 1.0 μm or less, the crack suppressing effect is significant. Moreover, the present inventors experiment by changing the Al composition x of the n-type $Al_xGa_{1-x}N$ optical confinement layer 12 from 4% to 8%. It became clear that the property of a laser diode is improved when the thickness of the n-type $Al_xGa_{1-x}N$ optical confinement layer 12 is from 0.3 μm to 1.0 μm, preferably from 0.5 μm to 0.8 μm.

(Second Embodiment)

Figure 4:
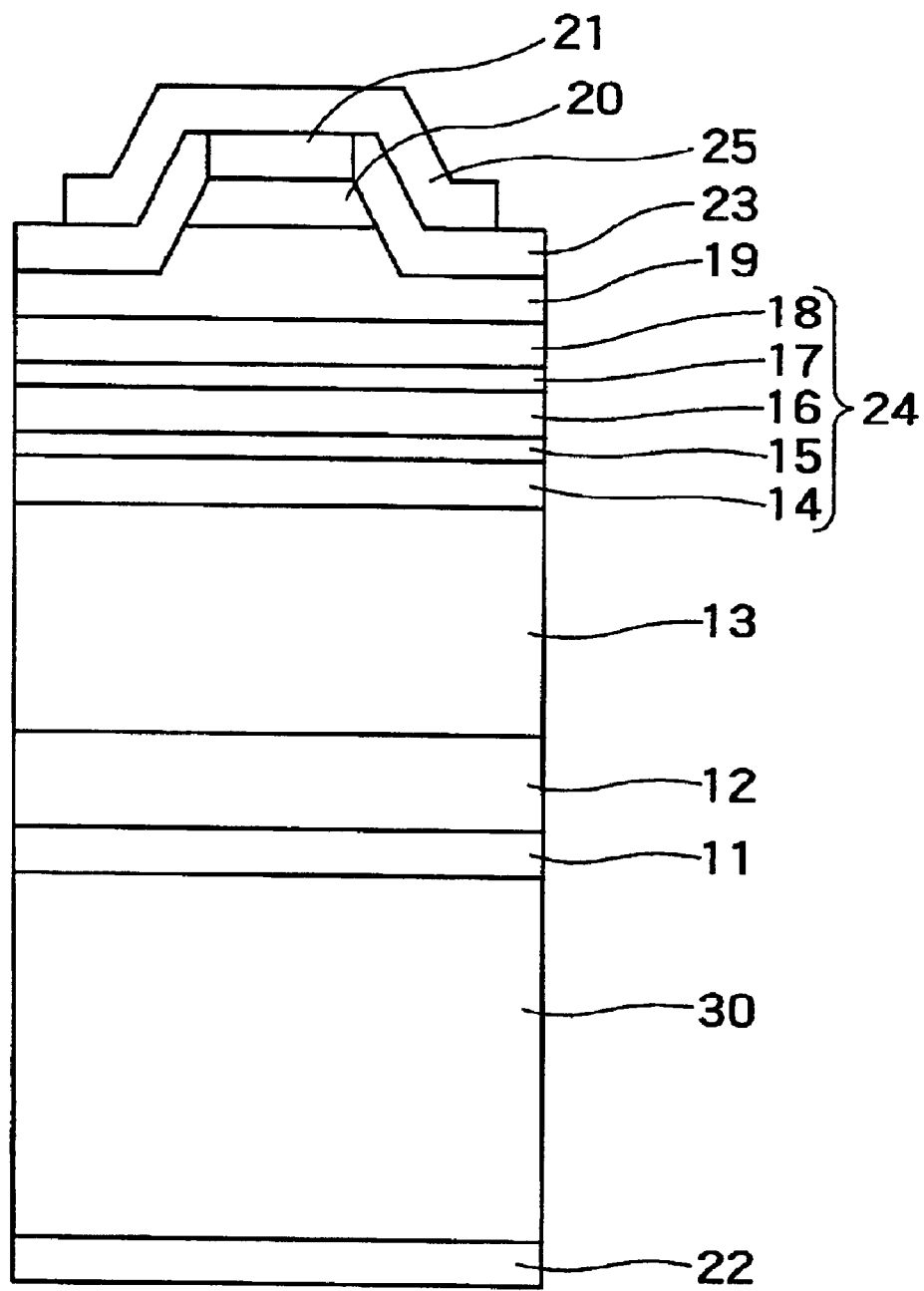
FIG. 4 is a schematic cross-sectional view showing a nitride compound semiconductor laser diode according to the second embodiment of the present invention.

FIG. 4 is a schematic cross-sectional view showing a nitride semiconductor laser diode according to the second embodiment of the present invention. The difference between the laser diode shown in FIG. 4 and the laser diode shown in first embodiment (FIG. 1) is that an n-type GaN substrate 30 having (0001) surface as a main surface is used instead of the sapphire substrate 10 and the n-side electrode 22 is formed at the bottom of the n-type GaN substrate 30. The basic structure of other parts is the same as the first embodiment (FIG. 1). So, detailed description will be omitted.

The same oscillation wavelength, maximum optical output in fundamental mode oscillation $TE_{00}$, and far field pattern are obtained with the laser diode in FIG. 4 as the first embodiment. The threshold current of the laser diode shown in FIG. 4 is 10 mA, which is lower than the first embodiment. This is because the laser diode shown in FIG. 4 is cleaved easily and cavity facets are formed effectively with high process yield. The lifetime of the laser diode in FIG. 4 becomes even longer than the first embodiment. The contact resistance of the n-side electrode 42 is reduced and the operation voltage becomes 4.1V, which is lower than the first embodiment.

In the first and second embodiment shown above, the sapphire substrate 10 having (0001) surface as a main surface or the n-type GaN substrate 30 having (0001) surface as a main surface is used. However, sapphire substrate having other surface as a main surface, GaN substrate having other surface as a main surface, Si substrate, SiC substrate, $Mg_2Al_4O$ substrate, GaAs substrate, can also be used.

In the embodiments shown above, the AlGaN/GaN superlattice clad layer using AlGaN with Al composition of 15% is indicated as the n-type clad layer 13. However, the Al composition may be changed. According to the experiment of the present inventors, the property of the laser diode is improved in the range of Al composition from 5% to 20%. From an analysis, the reason seems to be that when Al composition is less than 5%, the refractive index of the clad layer approaches the effective refractive index R of the oscillating mode(see FIG. 2) and the optical confinement effect of the clad layer is reduced, and when Al composition is more than 20%, cracks or dislocations are liable to occur in the clad layer. However, when Al composition of AlGaN of the AlGaN/GaN superlattice clad layer is lower than Al composition x of the n-type $Al_xGa_{1-x}N$ optical confinement layer 12, cracks or dislocations are apt to occur and the property of the diode is apt to deteriorate. And, when average Al composition of superlattice clad layer is lower than Al composition x of the n-type $Al_xGa_{1-x}N$ optical confinement layer 12, the property of the diode is apt to deteriorate.

In the embodiments shown above, the AlGaN/GaN superlattice clad layer is used as the n-type clad layer 13. However, the AlGaN clad layer may be used as the n-type clad layer 13. In this case, it is also preferable that Al composition of AlGaN clad layer is from 5% to 20% and higher than Al composition x of the n-type $Al_xGa_{1-x}N$ optical confinement layer 12 in order to improve the property of laser diode.

In the embodiments shown above, as a optical confinement layer 12, a layer made of $In_sGa_tAl_uB_{1-s-t-u}N (0 \leq s, t, u, s+t+u \leq 1)$ and having a tensile strain from 0.10% to 0.16% (see FIG. 3) against the GaN contact layer 12 may be used.

In the embodiments shown above, radiation property can be improved when laser diode is mounted on a material with high heat conductivity such as Cu, AlN, BN, diamond, etc. And radiation property can be further improved by using an upper side surface in the figure (surface near the active layer) as mounted surface. The laser diode may be mounted on a semiconductor integrated circuit suitable for miniaturization of an optical pick up module, or may be mounted on a semiconductor integrated circuit having a mirror surface.

Additional advantages and modifications will readily occur to those skilled in the art. Therefore, the invention in its broader aspects is not limited to the specific details and representative embodiments shown and described herein. Accordingly, various modifications may be made without departing from the spirit or scope of general inventive concept as defined by the appended claims and their equivalents.

What is claimed is:

1. A semiconductor laser diode, comprising:

a contact layer made of GaN;

a first conductive type nitride semiconductor layer formed on said contact layer and made of $Al_xGa_{1-x}N$ ($0.04 \leq x \leq 0.08$);

a first conductive type clad layer formed on said first conductive type nitride semiconductor layer and made of nitride semiconductor;

a core area formed on said first conductive type clad layer and made of nitride semiconductor, said core area including an active layer to emit light by electric current injection; and a second conductive type clad layer formed on said core area and made of nitride semiconductor;

wherein the thickness of said first conductive type nitride semiconductor layer is from 0.3 μm to 1.0 μm; and wherein said first conductive type clad layer contains $Al_yGa_{1-y}N (0.05 \leq y \leq 0.20, x<y)$.

2. A semiconductor laser diode according to claim 1, wherein said first conductive type clad layer has a superlattice structure in which $Al_yGa_{1-y}N (0.05 \leq y \leq 0.20, x<y)$ and GaN are alternately laminated.

3. A semiconductor laser diode according to claim 1, wherein said first conductive type clad layer has higher average composition of Al than said first conductive type nitride semiconductor layer.

4. A semiconductor laser diode according to claim 1, wherein said first conductive type nitride semiconductor layer has a refractive index lower than the effective refractive index of an oscillating mode in the semiconductor laser diode.

5. A semiconductor laser diode according to claim 1, wherein said first conductive type nitride semiconductor layer contains $Al_xGa_{1-x}N (0.04 \leq x \leq 0.07)$.

6. A semiconductor laser diode according to claim 1, wherein said contact layer is formed on a sapphire substrate.

7. A semiconductor laser diode according to claim 1, wherein said contact layer is made of first conductive type GaN and an electrode to inject electric current to said active layer is formed on said contact layer.

8. A semiconductor laser diode according to claim 1, wherein a second conductive type contact layer made of nitride semiconductor is formed on said second conductive type clad layer, and an electrode to inject electric current to said active layer is formed on said second conductive type contact layer.

9. A semiconductor laser diode according to claim 1, wherein said active layer has single or multiple quantum well structure having one or more InGaN quantum well layer.

10. A semiconductor laser diode according to claim 1, wherein said second conductive type clad layer has a superlattice structure in which $Al_zGa_{1-z}N (0<z \leq 1)$ and GaN are alternately laminated.

11. A semiconductor laser diode according to claim 1, wherein said first and second conductive type are n-type and p-type respectively.

12. A semiconductor laser diode, comprising:

an n-type GaN substrate;

an n-type GaN layer formed on one surface of said GaN substrate;

an n-type nitride semiconductor layer formed on said n-type GaN layer and made of $Al_xGa_{1-x}N$ ($0.04 \leq x \leq 0.08$);

an n-type superlattice clad layer formed on said n-type nitride semiconductor layer and having a superlattice structure in which $Al_yGa_{1-y}N(0.05 \leq y \leq 0.20, x<y)$ and GaN are alternately laminated;

a core area formed on said n-type superlattice clad layer and made of nitride semiconductor, said core area including an active layer having a multiple quantum well structure with multiple InGaN quantum well layers, said active layer emitting light by electric current injection;

a p-type superlattice clad layer formed on said core area and having a superlattice structure in which $Al_zGa_{1-z}N$ ($0<z \leq 1$) and GaN are alternately laminated;

a p-type GaN layer formed on said p-type superlattice clad layer made of a p-type GaN;

a p-type electrode formed on said p-type GaN layer injecting electric current into said active layer; and an n-type electrode formed on the other surface of said n-type GaN substrate in order to inject electric current into said active layers wherein the thickness of said n-type nitride semiconductor layer is from 0.3 µm to 1.0 µm.

13. A semiconductor laser diode according to claim 12, wherein said n-type nitride semiconductor layer has a refractive index lower than the effective refractive index of an oscillating mode in the semiconductor laser diode.

14. A semiconductor laser diode, comprising:

a first conductive type GaN substrate;

a GaN layer formed on one surface of said GaN substrate;

a first conductive type nitride semiconductor layer formed on said GaN layer and made of $Al_xGa_{1-x}N$ ($0.04 \leq x \leq 0.08$);

a first conductive type clad layer formed on said first conductive type nitride semiconductor layer and made of nitride semiconductor;

a core area formed on said first conductive type clad layer and made of nitride semiconductor, said core area including an active layer to emit light by electric current injection;

a second conductive type clad layer formed on said core area and made of nitride semiconductor;

a second conductive type GaN layer formed on said second conductive type clad layer;

a second conductive type electrode formed on said second conductive type GaN layer injecting electric current into said active layer; and a first conductive type electrode formed on the other surface of said GaN substrate in order to inject electric current into said active layer;

wherein the thickness of said first conductive type nitride semiconductor layer is from 0.3 µm to 1.0 µm.

15. A semiconductor laser diode according to claim 14, wherein said first conductive type clad layer contains $Al_yGa_{1-y}N(0.05 \leq y \leq 0.20, x<y)$.

16. A semiconductor laser diode according to claim 14, wherein said first and second conductive type are n-type and p-type respectively.

17. A semiconductor laser diode according to claim 14, wherein said first conductive type clad layer has a superlattice structure in which $Al_yGa_{1-y}N(0.05 \leq y \leq 0.20, x<y)$ and GaN are alternately laminated.

18. A semiconductor laser diode according to claim 14, wherein said second conductive type clad layer has a superlattice structure in which $Al_zGa_{1-z}N(0<z \leq)$ and GaN are alternately laminated.

19. A semiconductor laser diode according to claim 14, wherein said active layer has single or multiple quantum well structure having one or more InGaN quantum well layers.

20. A semiconductor laser diode, comprising:

a contact layer made of GaN;

a first conductive type nitride semiconductor layer formed on said contact layer and made of $Al_xGa_{1-x}N$ ($0.04 \leq x \leq 0.08$);

a first conductive type clad layer formed on said first conductive type nitride semiconductor layer and made of nitride semiconductor;

a core area formed on said first conductive type clad layer and made of nitride semiconductor, said core area including an active layer to emit light by electric current injection; and a second conductive type clad layer formed on said core area and made of nitride semiconductor;

wherein the thickness of said first conductive type nitride semiconductor layer is from 0.3 µm to 1.0 µm; and wherein said first conductive type clad layer has a superlattice structure in which $Al_yGa_{1-y}N(0.05 \leq y \leq 0.20, x<y)$ and GaN are alternately laminated.

21. A semiconductor laser diode, comprising:

a contact layer made of GaN;

a first conductive type nitride semiconductor layer formed on said contact layer and made of $Al_xGa_{1-x}N$ ($0.04 \leq x \leq 0.08$);

a first conductive type clad layer formed on said first conductive type nitride semiconductor layer and made of nitride semiconductor;

a core area formed on said first conductive type clad layer and made of nitride semiconductor, said core area including an active layer to emit light by electric current injection; and a second conductive type clad layer formed on said core area and made of nitride semiconductor;

wherein the thickness of said first conductive type nitride semiconductor layer is from 0.3 µm to 1.0 µm; and wherein said first conductive type clad layer has higher average composition of Al than said first conductive type nitride semiconductor layer.

* * * * *